US006602560B2

(12) United States Patent
Cheng et al.

(10) Patent No.: US 6,602,560 B2
(45) Date of Patent: Aug. 5, 2003

(54) METHOD FOR REMOVING RESIDUAL FLUORINE IN HDP-CVD CHAMBER

(75) Inventors: Yi-Lung Cheng, Danshuei Jen (TW); Wen-Kung Cheng, Miao-Li (TW); Ming-Hwa Yoo, I-Lan (TW); Szu-An Wu, Hsin-Chu (TW); Ying-Long Wang, Lung-Jing (TW); Pei-Fen Chou, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/196,850

(22) Filed: Jul. 16, 2002

(65) Prior Publication Data

US 2003/0068448 A1 Apr. 10, 2003

Related U.S. Application Data

(63) Continuation-in-part of application No. 09/975,391, filed on Oct. 9, 2001, now abandoned.

(51) Int. Cl.$^7$ .............................. C23C 16/40; H05H 1/24
(52) U.S. Cl. ................................. 427/579; 427/255.393
(58) Field of Search ................................. 427/569, 575, 427/578, 579, 248.1, 255.23, 255.28, 255.29, 255.37, 255.393

(56) References Cited

U.S. PATENT DOCUMENTS 6,020,035 A * 2/2000 Gupta et al. ................ 427/534

* cited by examiner

*Primary Examiner*—Shrive P. Beck
*Assistant Examiner*—William Phillip Fletcher, III
(74) *Attorney, Agent, or Firm*—Tung & Associates

(57) ABSTRACT

A method of removing residual fluorine present in a HDP-CVD chamber which includes a high pressure seasoning process, a dry-cleaning process, and a low-pressure deposition process.

16 Claims, 2 Drawing Sheets

HIGH RF SEASON
SiH4 + O2 + F ⟶ SiOF

MW NF3 CLEAN
NF3 + SiOF ⟶ SiF4(g) (PUMP OUT)

LOW PRESSURE / Si RICH OXIDE FILM
SiH4 + O2 + F ⟶ SiOF

METHOD FOR REMOVING RESIDUAL FLUORINE IN HDP-CVD CHAMBER

RELATED APPLICATIONS

This is a continuation-in-part (CIP) application of U.S. patent application Ser. No. 09/975,391, filed Oct. 9, 2001 now abandoned.

FIELD OF THE INVENTION

The present invention relates generally to methods for reducing residual contaminants in high density plasma chemical vapor deposition (HDP-CVD) processes and more particularly, to a method to quickly and effectively remove residual fluorine contamination present in HDP-CVD processing chambers.

BACKGROUND OF THE INVENTION

As devices become smaller and integration density increases, the high density plasma chemical vapor deposition (HDP-CVD) process has become a key process due to its gap-filling capability. In many cases it is advantageous to process both flourine-doped silicate glass (FSG) and undoped silicate glass (USG) in the same HDP-CVD machine. Undesirably, after processing FSG, residual fluorine remains, making it undesirable to use the same HDP-CVD machine in a subsequent USG process without a cleaning procedure. The high density and low pressures inherent in HDP-CVD processes increases sputtering on the process chamber interior surfaces. As a result, conventional techniques such as providing passivation layers for controlling the contaminant levels have proven to be ineffective in reducing contaminants to acceptable levels in high-density plasma environments.

The residual fluorine remaining in the HDP-CVD chamber can contaminate subsequent processing steps such as USG as well as alter important processing parameters thereby detrimentally affecting subsequent processing. For example, the deposition—sputtering rate ratio (D/S ratio) will undesirably decrease as a result of residual fluorine contamination. The D/S ratio is a commonly used measure of the gap-filling capability of the process. Among the disadvantages of a lower D/S ratio include the possibility of "corner clipping" or "edge erosion" along the edges of metal lines and the lowering of processing throughput since it requires a relatively longer period of time to achieve the formation of the HDP-CVD oxide.

One solution to the problem of fluorine contamination in HDP-CVD processes has been to subject the HDP-CVD chamber to a wet chemical cleaning process, requiring machine shut-down thereby resulting in a loss of valuable HDP-CVD apparatus up time.

There is, therefore, a needed solution and a method whereby both fluorine contamination and HDP-CVD apparatus down time is minimized, allowing for example, a more efficient shift in use of the HDP-CVD apparatus from FSG processing to USG processing.

It is therefore an object of the invention to provide a method whereby both fluorine contamination and HDP-CVD apparatus down time is minimized, allowing for example, a more efficient shift in use of the HDP-CVD apparatus from FSG processing to USG processing.

SUMMARY OF THE INVENTION

To achieve the foregoing and other objects, and in accordance with the purposes of the present invention, as embodied and broadly described herein, the present invention provides a method for removing residual fluorine in a HDP-CVD chamber.

According to one embodiment of the present invention, a method is provided for removing residual fluorine in a HDP-CVD chamber which includes forming a high density plasma in the presence of at least a microwave power, a silicon source, and an oxygen source whereby a silicon-rich oxide film is deposited over at least part of the inner surface of the HDP-CVD chamber; supplying a process gas comprising $NF_3$ in the presence of microwave power to form a plasma thereby removing fluorine from the silicon-rich oxide film into the gas phase; and, removing fluorine-containing gas from the HDP-CVD chamber.

In related embodiments, the silicon-rich oxide film comprises pores ranging from about 30 per cent by volume to about 90 percent by volume. Further, the silicon-rich oxide film is deposited at a pressure such that the silicon-rich oxide film is deposited substantially over an upper portion of the HDP-CVD chamber. Further yet, the silicon source includes silane and the oxygen source includes oxygen.

In another aspect according to the present invention, the method according to the present invention further includes supplying a control wafer to the HDP-CVD chamber; and, depositing a silicon-rich oxide film over the control wafer;

In another aspect of the present invention, the method according to the present invention further includes repeating at least one of the steps until fluorine present in the silicon-rich oxide film deposited over the control wafer reaches a pre-determined level.

In another embodiment, a method of removing residual fluorine in a HDP-CVD chamber which includes forming a high density plasma in the presence of at least microwave power, a silicon source, and an oxygen source whereby a first silicon-rich oxide film is deposited over at least a part of the inner surface of the HDP-CVD chamber; supplying a process gas comprising $NF_3$ in the presence of a microwave power to form a plasma thereby removing fluorine from the first silicon-rich oxide film into the gas phase; removing fluorine-containing gas from the HDP-CVD chamber; positioning a control wafer to the HDP-CVD chamber; and, depositing a second silicon-rich oxide film over the control wafer.

These and other embodiments, aspects, advantages and features of the invention will become better understood from a detailed description of the preferred embodiments of the invention which are described in conjunction with the accompanying drawings.

DETAILED DESCRIPTION OF THE PREFERRED EMBODIMENTS

In prior art processes, when a high density plasma chemical vapor deposition HDP-CVD chamber is changed from use in a fluorine-doped silicate glass process to an undoped silicate glass process, residual fluorine remaining on the interior surfaces of the HDP-CVD chamber can contaminate subsequent processes and cause undesirable changes in process parameters, such as a decrease in the deposition— sputtering rate ratio (D/S ratio). A lower D/S ratio can undesirably affect the gap-filling capability of the HDP-CVD process. Current processing methods include using either or both wet cleaning procedures and "dummy" wafer processing to remove any residual fluorine. The drawback of such methods is the extended time periods (e.g., more than twelve hours)required to complete such cleaning operations, resulting in a loss of valuable HDP-CVD machine up time.

In operation, according to the present invention, a relatively short procedure (in some cases as short as 10 minutes), may be used to reduce fluorine concentrations to base-line levels present in deposited films before carrying out of any fluorine contaminating film depositions. Although specific time periods for carrying out the steps according to the present invention may vary according to the level of residual fluorine, the specific time periods required may be readily determined by one having ordinary skill in the art according to given conditions.

Figure 1:
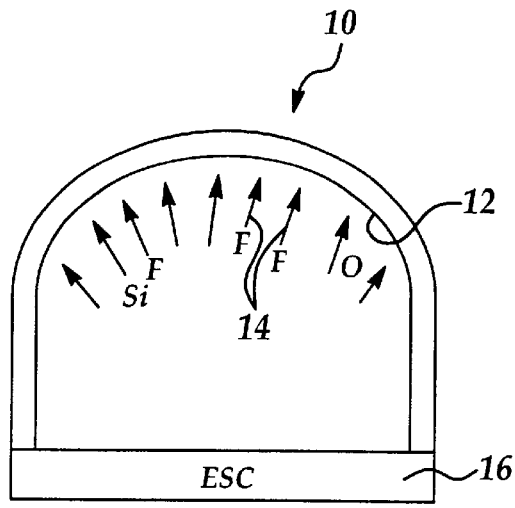
FIG. 1 is a graphical representation of a high pressure seasoning process according to the present invention.

According to the present invention, a high pressure seasoning process as shown in FIG. 1 is carried out under RF (microwave) power whereby a porous silicon-rich oxide film having pores ranging from about 30 volume percent to about 90 volume percent of the total volume of the silicon-rich oxide film is deposited over at least part of the inner surface of the HDP-CVD chamber 10 equipped with an electrostatic chuck (ESC) 16. Following long periods of exposure to the FSG film deposition process conducted in the HDP-CVD chamber 10, residual fluorine 14 from the FSG film deposition process diffuses into the pores of the silicon-rich oxide film which is deposited over the upper inner surface 12 (dome) of the HDP-CVD chamber 10. It is believed that the high pressure seasoning process according to the present invention, results in the deposition of a relatively porous silicon-rich oxide layer into which residual fluorine diffuses and reacts to form $Si_xO_yF$ where x+y=2.

In operation, according to the present invention, the seasoning process under RF (microwave) power is carried out under pressures from about 1 mTorr to about 1 Torr and preferably from about 2.5 mTorr to about 100 mTorr while the RF power applied may be selected within a range of about 100 W to about 5,000 W, and preferably within a range of about 1,500 W to about 4,000 W.

Figure 2:
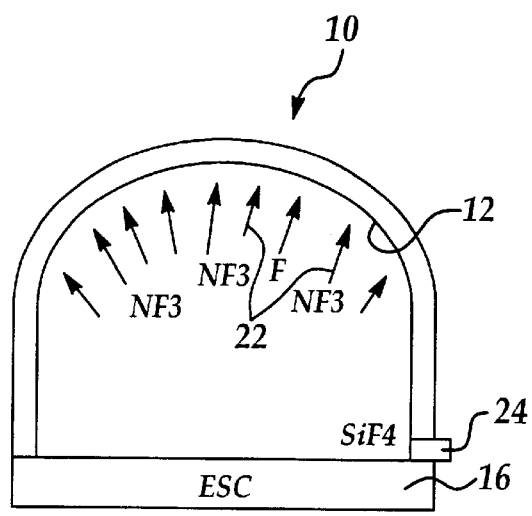
FIG. 2 is a graphical representation of a dry cleaning process using $NF_3$ according to the present invention.
Figure 3:
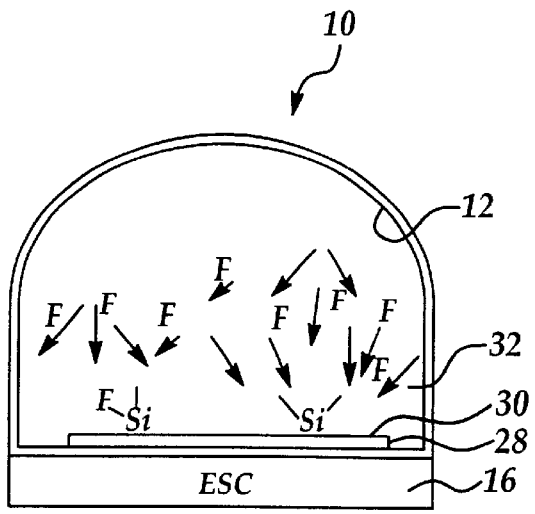
FIG. 3 is a graphical representation of a low pressure process according to the present invention.

Following the deposition of the porous silicon-rich oxide film and the diffusion of the residual fluorine into the pores of the silicon-rich oxide film, i.e. in a dry cleaning process shown in FIG. 2, a plasma of a $NF_3$-containing process gas 22 is formed in the presence of microwave power removes the residual fluorine in the porous silicon-rich oxide film by forming $SiF_4$ (gas), which is then removed by pumping out from the HDP-CVD chamber 10 through an outlet valve 24.

According to the present invention, a dry cleaning process may be carried out under the following conditions. The ambient pressure may range from about 1 mTorr to about 1 Torr and preferably from about 2.5 mTorr to about 100 mTorr while the RF power applied may be selected within a range of about 100 W to about 5,000 W, and preferably within a range of about 1,500 W to about 4,000 W. A flow rate of $NF_3$ into the HDP-CVD chamber may range from about 1500 sccm to about 2500 sccm.

Residual fluorine may be further removed by providing a control (dummy) wafer in the HDP-CVD chamber and depositing a silicon-rich oxide film over the control wafer to include the lower part of the HDP-CVD chamber.

According to the present invention, a dry cleaning process may be carried out under the following conditions. The ambient pressure may range from about 1 mTorr to about 1 Torr and preferably from about 2.5 mTorr to about 100 mTorr while the RF power applied may be selected within a range of about 100 W to about 5,000 W, and preferably within a range of about 1,500 W to about 4,000 W.

It is believed that residual fluorine tends to diffuse into the silicon-rich oxide film where it is bounded and immobilized by reaction with a Si-dangling bond to form a film of the form $SiO_xF_y$. In operation, it is believed that under lower pressure conditions a silicon-rich oxide film 30 tends to preferentially form in the lower portion of the HDP-CVD chamber 10 on dummy wafer 28.

Figure 4:
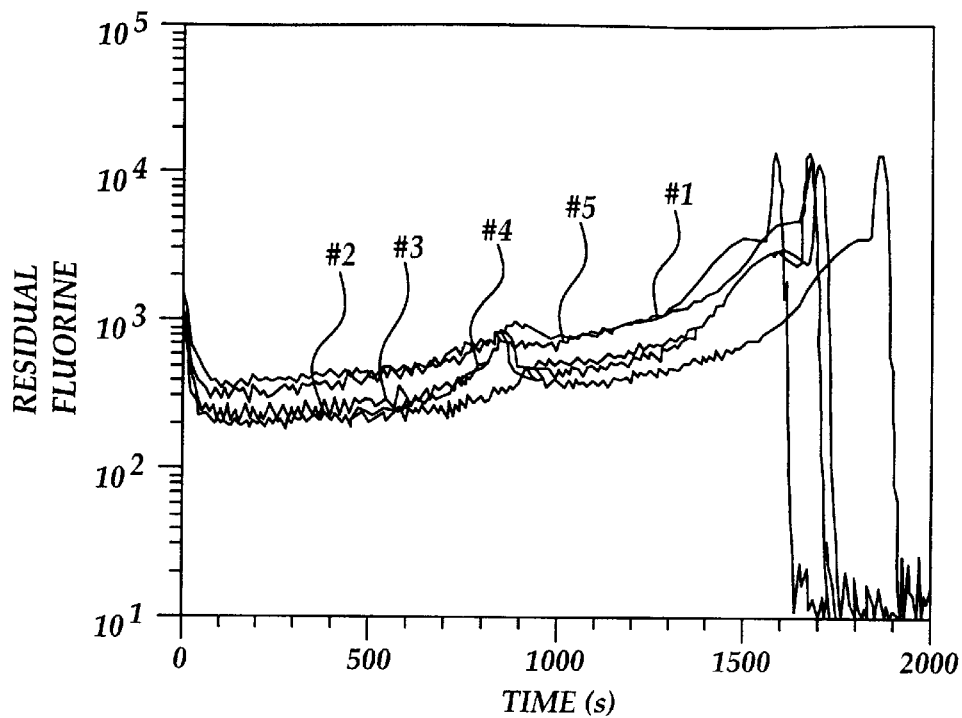
FIG. 4 is a graph of a SIMS signal representing residual fluorine versus sputter time.
Figure 5:
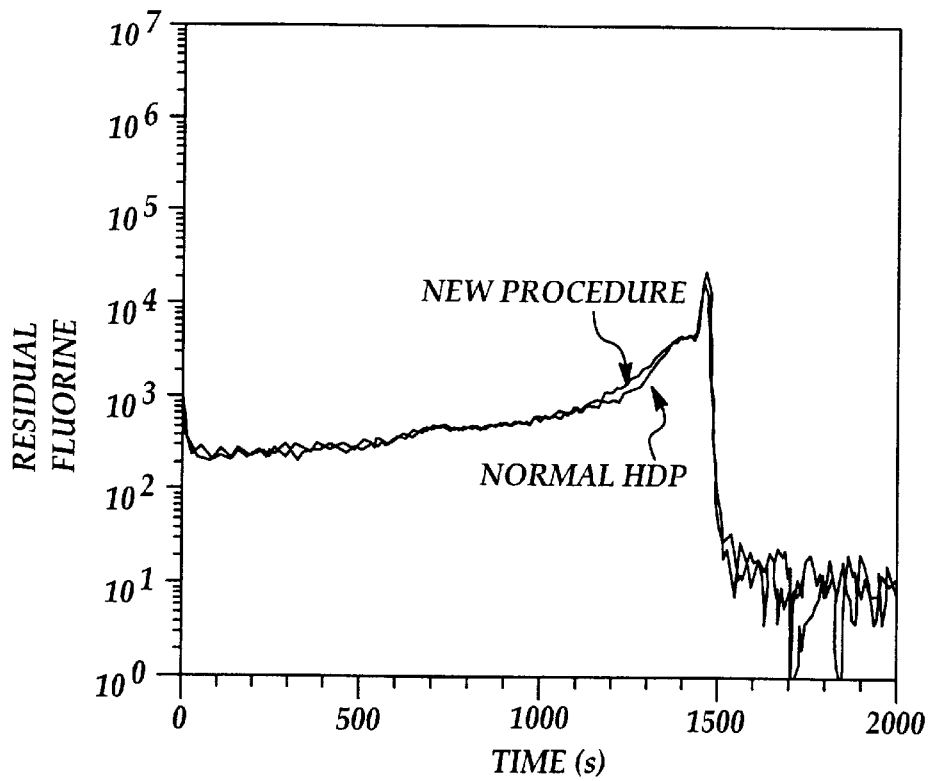
FIG. 5 is a graph of a SIMS signal representing residual fluorine versus sputter time.

In operation, according to the present invention, residual fluorine appearing in deposited films may be reduced to predetermined levels, such as the baseline fluorine content present prior to carrying out any fluorine-contaminating FSG processes, as shown by Secondary Ion Mass Spectroscopy (SIMS) in FIG. 5. FIG. 5 is a graphical representation of a SIMS signal representing residual fluorine versus sputter time. The vertical access is residual fluorine detected in counts per second as the target surface is sputtered away over a period of time as represented on the horizontal axis in seconds. For comparison purposes, FIG. 4 shows residual fluorine contamination levels present in deposited films after carrying out FSG processes. By contrast, in FIG. 5 it is clearly seen that under the "New Procedure" according to the present invention, residual fluorine levels in the HDP-CVD chamber can be reduced to base-line levels seen where only fluorine-free or USG processes have previously been carried out, i.e., "Normal HDP".

Further, according to the present invention, any of the steps according to the present invention, including the high pressure seasoning step, the dry cleaning step, and the low pressure control wafer processing step may be repeated in any order to reach a predetermined residual fluorine level present in deposited films.

It will be understood that numerous variations according to the invention will become obvious to those skilled in the art without departing from the scope of the inventive concept presented.

What is claimed is:

1. A method of removing residual fluorine in a high density plasma chemical vapor deposition (HDP-CVD) chamber used in processing fluorine-doped silicate glass comprising the steps of:

forming a high density plasma in the presence of at least a microwave power, a silicon source, and an oxygen source whereby a silicon-rich oxide film having pores ranging from about 30 volume percent to about 90 volume percent of the total volume of said silicon-rich oxide film is deposited over at least part of the inner surface of the HDP-CVD chamber;

conducting at least one deposition process of the fluorine-doped silicate glass in said HDP-CVD chamber generating residual fluorine for diffusing into said pores of said silicon-rich oxide film;

flowing a process gas comprising $NF_3$ into said HIDP-CVD chamber in the presence of microwave power to form a plasma thereby removing fluorine from said silicon-rich oxide film to form a fluorine-containing gas; and removing said fluorine-containing gas from said HDP-CVD chamber.

2. The method of claim 1, where the silicon-rich oxide film comprises pores ranging from about 45 per cent by volume about 75 percent by volume of the total volume of said silicon-rich oxide film.

3. The method of claim 1, wherein the silicon-rich oxide film is deposited at a pressure such that the silicon-rich oxide film is deposited substantially over an upper portion of the HDP-CVD chamber.

4. The method of claim 1, wherein the silicon source comprises silane and the oxygen source comprises oxygen.

5. The method of claim 1, further comprising the steps of:
supplying a control wafer to the HDP-CVD chamber; and
depositing a second silicon-rich oxide film over the control wafer.

6. The method of claim 5, wherein the step of depositing the second silicon-rich oxide film further comprises:
depositing the second silicon-rich oxide film over the control wafer under pressures such that the second silicon-rich oxide film is formed substantially over the control wafer to include a lower portion of the HDP-CVD chamber.

7. The method of claim 1 wherein the step of depositing a silicon-rich oxide film further comprises:
depositing the silicon-rich oxide film at pressures from about 3 mTorr to about 6 mTorr.

8. The method of claim 5 wherein the step of depositing the second silicon-rich oxide film further comprises:
depositing the second silicon rich oxide film over the control wafer at pressures from about 3 mTorr to about 6 mTorr.

9. A method of removing residual fluorine in a HDP-CVD chamber comprising the steps of:
forming a high density plasma in the presence of at least a microwave power, a silicon source, and an oxygen source whereby a first silicon-rich oxide film having pores ranging from about 30 volume percent to about 90 volume percent of the total volume of said first silicon-rich oxide film is deposited over at least part of the inner surface of the HDP-CVD chamber;
conducting at least one deposition process of fluorine-doped silicate glass in said HDP-CVD chamber generating residual fluorine which diffuses into said pores of said silicon-rich oxide film during said at least one deposition process;
flowing a process gas comprising $NF_3$ into said HDP-CVD chamber in the presence of microwave power to form a plasma thereby removing fluorine from the first silicon-rich oxide film to form a fluorine-containing gas;
removing said fluorine-containing gas from said HDP-CVD chamber;
positioning a control wafer in the HDP-CVD chamber; and
depositing a second silicon-rich oxide film over the control wafer.

10. The method of claim 9, wherein the first silicon-rich oxide film comprises pores ranging from about 45 percent by volume to about 75 percent by volume of the total volume of said silicon-rich oxide film.

11. The method of claim 9, where the second silicon-rich oxide film comprises pores ranging from about 30 percent by volume to about 90 percent by volume of the total volume of said silicon-rich oxide film.

12. The method of claim 9, wherein the first silicon-rich oxide film is deposited at a pressure such that the first silicon-rich oxide film is deposited substantially over an upper portion of the HDP-CVD chamber.

13. The method of claim 9, wherein the first silicon-rich oxide film is deposited at ambient pressures ranging from about 2.5 mTorr to about 100 mTorr.

14. The method of claim 9, wherein the second silicon-rich oxide film is deposited at a pressure such that the second silicon-rich oxide film is deposited substantially over a lower portion of the HDP-CVD chamber to include the control wafer.

15. The method of claim 9, wherein the second silicon-rich oxide film is deposited at ambient pressures ranging from about 2.5 mTorr to about 100 mTorr.

16. The method of claim 9, wherein the silicon source comprises silane and the oxygen source comprises oxygen.

* * * * *